United States Patent [19]
Laugesen

[11] 3,995,232
[45] Nov. 30, 1976

[54] INTEGRATED CIRCUIT OSCILLATOR

[75] Inventor: Ronald C. Laugesen, Sunnyvale, Calif.

[73] Assignee: National Semiconductor Corporation, Santa Clara, Calif.

[22] Filed: May 2, 1975

[21] Appl. No.: 573,912

[52] U.S. Cl. ............................ 331/111; 331/108 D
[51] Int. Cl.² .......................................... H03B 5/12
[58] Field of Search ............ 331/111, 108 C, 108 D, 331/113, 143

[56] References Cited
UNITED STATES PATENTS

| | | | |
|---|---|---|---|
| 3,156,875 | 11/1964 | Florino et al. | 331/111 |
| 3,295,069 | 12/1966 | Perry | 331/143 |
| 3,339,155 | 8/1967 | Camenzind | 331/111 |
| 3,351,871 | 11/1967 | Swain | 331/111 |
| 3,708,757 | 1/1973 | Savarese et al. | 331/111 |
| 3,742,384 | 6/1973 | Breitzmann | 331/111 |
| 3,886,485 | 5/1975 | Takahashi | 331/113 |
| 3,904,988 | 9/1975 | Hsiao | 331/108 C |
| 3,904,989 | 9/1975 | Cordell | 331/113 |

OTHER PUBLICATIONS
Voltage–Controlled Oscillator, Cox et al. IBM Tech. Bul. vol. 14, No. 1, JN, 1971.

*Primary Examiner*—John Kominski
*Attorney, Agent, or Firm*—Lowhurst & Aine

[57] ABSTRACT

An integrated circuit oscillator includes a timing circuit and a bistable circuit for controlling the timing circuit. The timing circuit includes a capacitor and a pair of field effect transistors (FET), one of which is employed for charging the capacitor and the other of which is employed for discharging the capacitor. A first stage having a relatively low trip voltage is responsive to a low level of charge on the capacitor for actuating the bistable circuit to a first state and a second stage having a relatively high trip voltage is responsive to a high level of charge on the capacitor for actuating the bistable circuit to a second state. The charging and discharging FET's are rendered conductive in response to the first and second states, respectively, of the bistable circuit, such that the capacitor is both charged and discharged over relatively long time periods. A pair of clamping circuits connected to the charging and discharging FET's reduce frequency variations which would normally occur with variations in process parameters and variations in the voltage level of the power supply.

6 Claims, 9 Drawing Figures

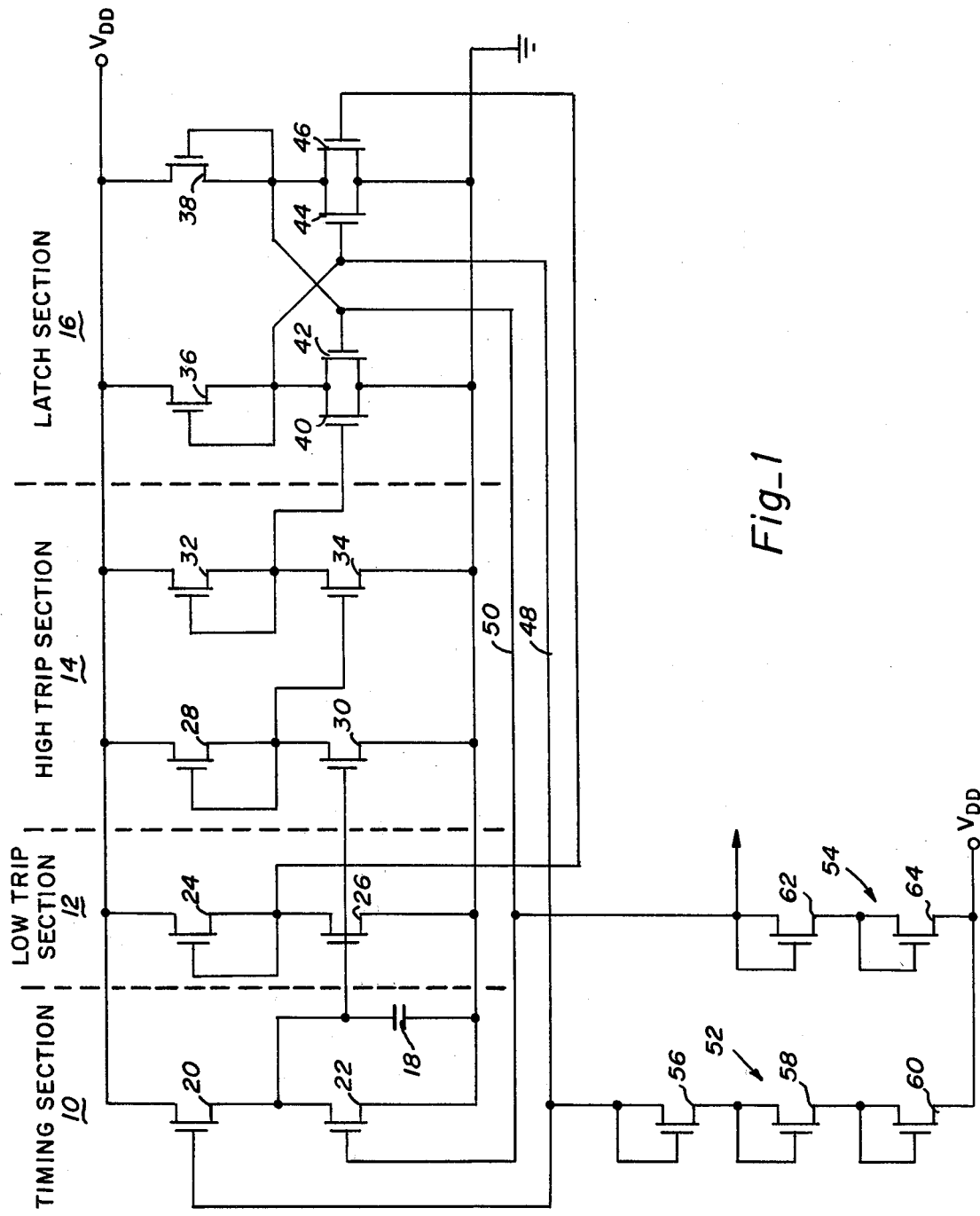
Fig_1

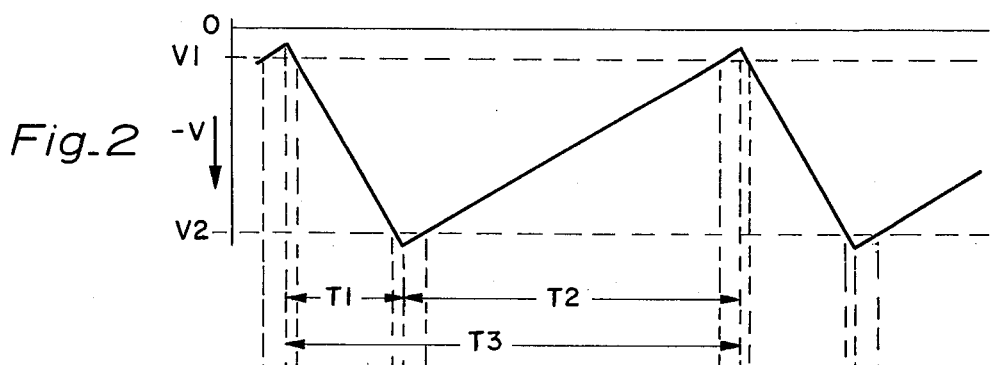
Fig._2
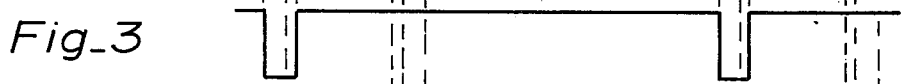
Fig._3
Fig._4
Fig._5
Fig._6
Fig._7
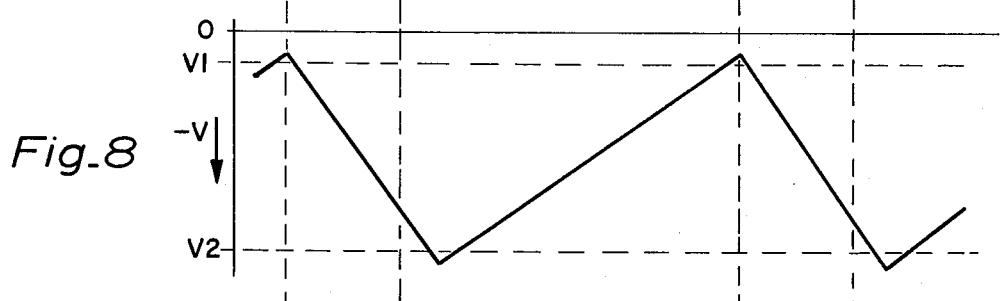
Fig._8
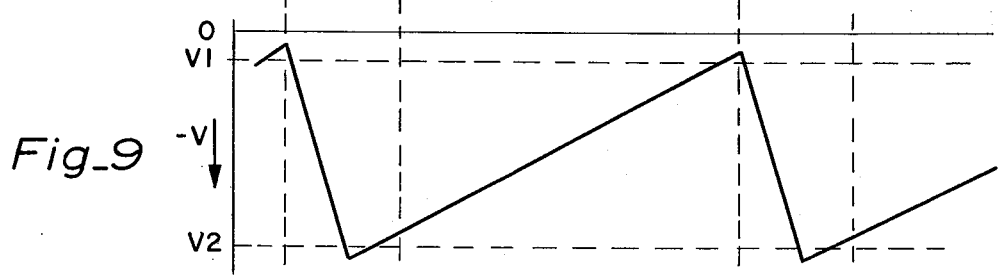
Fig._9

3,995,232

INTEGRATED CIRCUIT OSCILLATOR

BACKGROUND OF THE INVENTION

1. Field of the Invention

This invention relates generally to oscillators, and more particularly to an oscillator which is completely contained in a single integrated circuit chip.

2. Prior Art

A number of different types of oscillators are available for integrated circuit configurations. These integrated circuit oscillators exhibit extreme variations in frequency with variations in process parameters and with variations in the voltage level of their power supply. Those process parameters which provide the largest variations are the enhancement threshold voltage and the mobility and gate capacitance of field effect transistors (FET). Since the resistance of an FET does not vary significantly with variations in the voltage level of the power supply, the time required to charge or discharge each node of the oscillator circuit varies with variations in the voltage level of the power supply. Accordingly, it can be appreciated that variations in process parameters and variations in the voltage level of the power supply connected to the oscillator cause variations in the frequency of the output signal of the oscillator. Frequency variations of 20 to 1 can be expected from such prior known oscillators because of process parameter variations and power supply variations.

Previous oscillators also exhibited start up problems. That is, relatively small variations in the process parameters of prior known oscillators could result in that oscillator being incapable of starting. Also, race condition problems exist in some of these prior known oscillators. 132

Previous integrated circuit oscillators were also susceptible to the problem of having more than one stable oscillation frequency. Usually, this problem was encountered when the voltage level of the oscillator power supply dropped below a predetermined amplitude. This problem also resulted in some of the prior known integrated circuit oscillators when the power supply voltage was turned on and applied to the oscillator at a relatively slow rate.

Some of the prior known integrated circuit oscillators, particularly those in which the effects of some of the above mentioned problems were reduced, required a relatively large number of components. Some of these integrated circuit oscillators also required more than one timing capacitor, such that a change or adjustment of the nominal frequency of the oscillator required a change of more than one component or capacitor in that circuit.

Furthermore, some of these prior known integrated circuit oscillators required certain components which could not be integrated into a circuit chip. Usually, the timing resistance and capacitance devices in prior known oscillators are of a size which does not permit them to be in the form of an integrated circuit. It has been the practice in the past to determine the frequency of oscillation by the size of these timing components; that is, by the RC time constant of the circuit. If a relatively low frequency of oscillation is desired, the size of the timing components is relatively large, thereby rendering them unsuitable for inclusion in an integrated circuit.

It can be appreciated, therefore, that a need exists for an integrated circuit oscillator in which all of its components can be integrated into a circuit chip and which exhibits a relatively small variation in frequency with variations in process parameters and/or variations in power supply levels. A need also exists for such an oscillator which has no start up problems, only one stable oscillation frequency, and is not subject to race conditions.

SUMMARY OF THE INVENTION

Accordingly, it is a primary object of the present invention to provide an integrated circuit oscillator which exhibits relatively small variations in frequency with variations in process parameters.

Another object of the present invention is to provide an integrated circuit oscillator which provides relatively small variations in frequency with variations in power supply levels.

A further object of the present invention is to provide an integrated circuit oscillator having only one stable oscillation frequency.

Still another object of the present invention is to provide an integrated circuit oscillator in which its nominal frequency can be changed or adjusted by the replacement of only one component or capacitor thereof.

Another object of the present invention is to provide an integrated circuit oscillator which is not prone to race conditions.

These and other objects of the present invention are attained by an integrated circuit oscillator which includes a circuit element for charging a capacitor for a first time period, another circuit element for discharging the capacitor for a second time period, and a circuit responsive to a first level of charge on the capacitor for enabling the discharging circuit element at the beginning of the second time period and for disabling the discharging circuit element at the end of the second time period. More particularly, the integrated circuit oscillator of the present invention attempts to balance the charge time of the capacitor with the discharge time of the capacitor, rather than making one of these times as small as possible, such that the effects of variations in process parameter and power supply levels during the charging time of the capacitor will tend to offset those same variations during the discharging time of the capacitor.

The invention, however, as well as other objects, features and advantages thereof will be more fully realized and understood from the following detailed description, when taken in conjunction with the accompanying drawings, wherein:

BRIEF DESCRIPTION OF THE DRAWINGS

FIG. 1 is schematic diagram of an integrated circuit oscillator constructed in accordance with the principles of the present invention.

FIG. 2 is a graphical representation of an idealized waveform of the variations in the voltage charge versus time on the timing capacitor of the oscillator illustrated in FIG. 1.

FIGS. 3–7 are graphical representations of idealized waveforms of the trip and latch sections of the oscillator illustrated in FIG. 1.

FIGS. 8 and 9 are graphical representations of idealized waveforms of the charge on the capacitor of the oscillator illustrated in FIG. 1 under extreme threshold voltage conditions.

DETAILED DESCRIPTION OF THE PREFERRED EMBODIMENT

With reference to FIG. 1, there is shown an integrated circuit oscillator which is constructed in accordance with the principles of the present invention. The oscillator includes a timing section 10, a low trip section 12, a high trip section 14, and a latch section 16. The timing section 10 includes a capacitor 18 having one side thereof connected to a charging FET 20 and to a discharging FET 22. The FET's 20 and 22 are connected in series between a source of negative potential, $V_{DD}$, which constitutes the output voltage of a power supply (not shown) and ground potential. When the FET 20 is rendered conductive and the FET 22 nonconductive, the capacitor 18 charges at a first rate in a negative direction, and when the FET 22 is rendered conductive and the FET 20 nonconductive, the capacitor 18 is discharged at a second rate.

The level of charge on the capacitor 18 is sensed by both the low trip section 12 and the high trip section 14 to control the latch section 16. The charge and discharge of the capacitor 18 is graphically illustrated by the waveform shown in FIG. 2. When the charge on the capacitor 18 becomes more positive than the voltage level VI as shown in FIG. 2, the low trip section provides a high level output to set the latch section 16. As used herein, a high level refers to a level which is relatively close to the negative supply voltage and will be considered as a logic 1 level, and a low level refers to a level which is relatively close to ground potential and will be considered as a logic 0 level.

When the charge on the capacitor 18 becomes more negative than the voltage level V2 as shown in FIG. 2, the high trip section 14 provides a high level output to reset the latch section 16. When the latch section 16 is reset, FET 20 is rendered nonconductive and FET 22 is rendered conductive to discharge the capacitor 18. When the latch section 16 is set, FET 20 is rendered conductive and FET 22 is rendered nonconductive to charge the capacitor 18. Accordingly, it can be appreciated that the oscillator circuit illustrated in FIG. 1 provides an output which varies in accordance with the above described cyclic operation.

With reference to FIG. 1 in greater detail, the low trip section 12 is formed of a single inverter stage which includes a depletion FET 24 and an enhancement FET 26 having a relatively low trip point. The FET 24 is connected as a current source load in series with the FET 26.

As used herein, the threshold voltage of an enhancement FET shall mean that gate-source voltage at which the FET is at the transition between a conductive and a nonconductive state thereof. The trip point of a stage, however, is that voltage level on the gate of the inverter FET at which the output of the stage toggles or changes from one binary level to another binary level. A stage is considered to have toggled or changed to a different binary level when its output has passed through the trip point of the succeeding stage. The low trip section 12 has a trip point which is relatively close to the threshold voltage of the FET 26. The threshold voltage of enhancement FETs is in the range of approximately −1 to −2 volts.

Initially, the capacitor 18 is discharged, thereby rendering the FET 26 nonconductive, such that the output of the low trip section 12 is at a high negative level to set the latch section 16. When the latch section 16 is set, the FET 20 is rendered conductive to charge the capacitor 18.

The high trip section 14 is formed of a first inverter stage which includes a depletion FET 28 and an enhancement FET 30. The FET 28 is connected as a current source load in series with the FET 30 and the stage has a trip point which is considerably greater than one threshold voltage drop. The high trip section 14 also includes a second inverter stage which is formed of a depletion FET 32 and an enhancement FET 34. The FET 32 is connected as a current source load in series with the FET 34 and the stage inverts the signal at the drain of the FET 30 and supplies it to the latch section 16. Initially, when the capacitor 18 is discharged, a high negative level output is provided at the drain of the FET 30 and a low negative level output is provided at the drain of the FET 34.

The latch section 16 is a bistable or flip flop circuit which includes a pair of depletion FET's 36 and 38 connected as current source loads for FET's 40 and 42 and FET's 44 and 46, respectively. It will be noted that the drain of the FET's 40 and 42 is connected to the gate of the FET 44 and that the drain of the FET's 44 and 46 is connected to the gate of the FET 42, such that the output of the latch section 16 will remain latched until a low level signal is supplied to either the FET 40 or to the FET 46. Outputs of the latch section 16 on lines 48 and 50 are connected to the gates of the FET's 20 and 22, respectively.

The oscillator of the present invention attempts to set a frequency based on both the charge and discharge intervals of the capacitor 18. Previously designed ring counter oscillators have exhibited frequency versus threshold voltage characteristics in which the frequency decreases as the threshold voltage increases. Another type of prior known oscillator has a frequency versus threshold voltage characteristic in which the frequency increases as the threshold voltage increases. The oscillator of the present invention, by setting a frequency based on both the charge and discharge intervals of the capacitor 18, combines these two frequency versus threshold voltage characteristics in an effort to reduce the adverse effects on the frequency which are caused by threshold voltage variations. This is accomplished by employing a circuit configuration for charging the capacitor 18 in which the frequency is inversly proportional to the threshold voltage, and a circuit configuration for discharging the capacitor 18 in which the frequency is directly proportional to the threshold voltage. This results in an oscillator circuit in which the charge and discharge rates vary by a predetermined factor with variations in process parameters, but vary in opposite directions to one another. Accordingly, the oscillator of the present invention provides a relatively stable oscillation frequency.

In order to accomplish the above described results, it is necessary to obtain a balance between the time to charge and the time to discharge the capacitor 18, rather than attempting to reduce one of those times to an absolute minimum. This is partially accomplished by designing the low trip section 12 and the high trip section 14 with respective trip points which are relatively far apart from one another. Accordingly, the change in the voltage drop across the capacitor 18 is maximized. As can be appreciated from the well known expression, $$i \cdot dt = c \cdot dv, \tag{1}$$

where $i$ is equal to the charging or discharging current, $c$ is equal to the value of capacitance, and $dv/dt$ is equal to the time rate of charge of the voltage on the capacitor, when the voltage change on the capacitor 18 is maximized, the time to charge or discharge is increased.

Accordingly, when the voltage change on the capacitor 18 is maximized, a low frequency oscillator is obtained in which the charging and discharging rates of the capacitor 18 can be balanced. Furthermore, it can be appreciated that the charging time on the capacitor can be increased without increasing the size of the capacitor 18 or the size of the FET's 20 and 22. Accordingly, a relatively small capacitor can be employed as the capacitor 18, thereby permitting the capacitor 18 to be in the form of an integrated circuit capacitor.

A graphical representation of the charge on the capacitor 18 versus time is illustrated in FIG. 2. As shown therein, the capacitor 18 is charged over a time period T1 and discharged over a time period T2, such that the period of oscillation of the oscillator illustrated in FIG. 1 is T3. As previously mentioned, the charging portion of the oscillator circuit has a characteristic in which the time period T1 is proportional to threshold voltage, and the discharging portion of the oscillator illustrated in FIG. 1 has a characteristic in which the time period T2 is inversely proportional to threshold voltage. Accordingly, the circuit can be designed such that variations of threshold voltage, which is one of the process parameters, results in a relatively stable oscillation frequency.

As previously mentioned, when the charge on the capacitor 18 becomes more positive than the voltage level V1, the low trip section 12 provides a high level output, such as shown in FIG. 3. When the charge on the capacitor 18 becomes more positive than the voltage level V2, the first stage of the high trip section 14 provides a high level output as shown in FIG. 4 and the second stage thereof provides a low level output as shown in FIG. 5. However, when the charge on the capacitor 18 exceeds the voltage level V2 in a negative direction the output of the high trip section 14 changes from a low level to a high level as shown in FIG. 5. The outputs of the latch section 16 on lines 48 and 50 are illustrated in FIGS. 6 and 7, respectively. Accordingly, when the low trip section 12 changes from a low level to a high level, the latch section 16 is set to change the voltage level on the line 48 from a low level to a high level. Also, when the output of the high trip section 16 changes from a low level to a high level, the output on the line 50 changes from a low level to a high level as shown in FIG. 7. Because of the latching characteristic of the section 16, a change of state from a high level to a low level at the output of either the low trip section 12 or the high trip section 14 does not affect the state of the latch section 16. The delay between the time that the sections 12 and 14 change from a low level to a high level to the time that the output of the latch section 16 changes states is caused by a signal propagation delay in the latch section 16. This delay permits the capacitor 18 to charge to a level greater than the voltage level V2 and to discharge to a voltage level less than the voltage level V1, so that the latch 16 will have sufficient time to toggle completely.

Race condition problems do not exist in the oscillator circuit of the present invention, since it is necessary that the latch section 16 completely change its output state before the timing portion of the circuit can begin a succeeding portion of its cycle. That is, while the capacitor 18 is charging in a negative direction, it is necessary for the charge on the capacitor 18 to exceed the voltage level V2 before the latch section 16 can change its state. Since the output state of the latch section 16 does not change while the capacitor 18 is discharging from the maximum charge thereon to and through the voltage level V2, the capacitor 18 will continue to discharge until the charge thereon becomes less than the voltage level V1. The same condition exists during the charge of the capacitor 18 and, therefore, it can be appreciated that race condition problems are completely eliminated.

Because of the relatively large difference between the trip points of the low trip section 12 and the high trip section 14, and because of an imbalanced condition in the latch section 16, start up problems do not exist in the oscillator circuit of the present invention. If the capacitor 18 is completely discharged, the latch section 16 will be set, and if the capacitor 18 is fully charged, the latch section 16 will be reset. However, if the capacitor 18 is initially only partially charged and its charge is between the voltage levels V1 and V2 in FIG. 2, the imbalance in the latch section 16 will cause its output on the line 48 to be at a high level and its output on the line 50 to be at a low level. In an constructed embodiment of the present invention, the size of the FET 36 was made one half the size of the FET 38, such that this initial output state will be achieved.

Variations in the voltage level of the power supply also cause variations in the frequency of the oscillator, since the charging and discharging times of the capacitor 18 vary in direct proportion to variations in the power supply. This problem is substantially eliminated by a first clamping circuit, generally designated with the reference numeral 52 which is connected between the gate of the FET 20 and ground potential, and by a second clamping circuit, generally designated with the reference numeral 54, connected between the gate of the FET 22 and ground potential. The clamping circuit 52 includes three FET's 56, 58 and 60 connected in series with one another and each having their gate connected to their source. Accordingly, as the latch section 16 changes states, such that the signal on the output line 48 changes from a low level to a high level, the FET's 56, 58 and 60 will begin to conduct when a voltage level is attained on the line 48 equal to three threshold voltage drops. Ideally, the voltage drop across the clamping circuit 52 when the FET's 56, 58 and 60 begin to conduct is equal to the minimum expected voltage level of the power supply. If the clamping circuit 52 holds the voltage on the gate of the FET 20 constant with variations in the voltage level of the power supply after it begins to conduct, its saturation current will be directly proportional to the process parameter, threshold voltage. This result is not desirable, since it is preferred that the saturation current of the FET 20 be inversely proportional to threshold voltage. Accordingly, a compromise is achieved wherein the effects of power supply variations on the gate of the FET 20 are partially eliminated while maintaining a saturation current in the FET 20 indirectly proportional to threshold voltage. This is accomplished by dimensioning the FET's 56, 58 and 60 in relation to the size of the FET 36 such that the voltage on the line 48 will not remain constant with variations in the power supply when the latch section 16 is set, but will be proportional to the voltage level of the power supply. However, the variations in the voltage on the line 48 when the latch section 16 is set will be less than the power supply variations. Accordingly, the clamping circuit 52 is a "soft" clamp. Such "soft" clamping of the voltage on the gate of the FET 20 then permits its saturation current to be indirectly proportional to threshold voltage.

The clamping circuit 54 includes a pair of FET's 62 and 64 connected in series with one another and each having their gate connected to their source, such that the line 50 will not exceed two threshold voltage drops when the latch section 16 is reset. The clamping circuit 54, therefore, limits the drive on the FET 22, such that the FET 22 will exhibit a relatively high value of resistance while it is in its conducting state. This has the affect of increasing the discharging time of the capacitor 18 without increasing the size of the FET 22. In addition, the saturation current of the FET 22 is proportional to its gate-source voltage less its threshold voltage. However, since its gate-source voltage is equal to two threshold voltage drops, its saturation current will be proportional to two threshold voltage drops minus one threshold voltage drop, or one threshold voltage drop. Accordingly, the saturation current of the FET 22 will be directly proportional to threshold voltage. Furthermore, the FET's 62 and 64 are dimensioned relative to the size of the FET 38 such that the circuit 54 is a "hard" clamp. Therefore, power supply variations will not appreciably affect the voltage on the gate of the FET 22, thereby maintaining the discharging current through the capacitor 18 constant with variations in the power supply.

Since the saturation current of the FET 20 is indirectly proportional to threshold voltage and the saturation current of the FET 22 is directly proportional to threshold voltage, a change in the threshold voltage (process dependent) will have an opposite affect on these saturation currents. The result of this condition is illustrated in FIGS. 8 and 9. FIG. 8 represents the condition in which the threshold voltage is greater than that which would produce the waveform illustrated in FIG. 2. More particularly, an increase in the threshold voltage will cause a decrease in the charging current and an increase in the discharging current. Accordingly, the time required to charge the capacitor 18 will increase and the time to discharge the capacitor 18 will decrease, thereby maintaining the period of oscillation substantially constant.

FIG. 9 represents the condition in which the threshold voltage is less than that which produces the waveform illustrated in FIG. 2. A decrease in the threshold voltage will cause an increase in the charging current and a decrease in the discharging current. Accordingly, the time required to charge the capacitor 18 will decrease and the time to discharge the capacitor 18 will increase, thereby maintaining the period of oscillation substantially constant.

Accordingly, it can be appreciated that the period of oscillation is substantially insensitive to variations in process parameters and variations in the voltage level of the power supply. This result is partially accomplished by setting the trip points of the stages 12 and 14 relatively far apart to maximize the voltage swing on the capacitor 18. The clamping circuits 52 and 54 also contribute to this result by causing the change in charging rate to offset the change in the discharging rate with variations in such process parameters. The clamping circuits 52 and 54 also reduce the effects of variations in the voltage level of the power supply by maintaining the drives to the FET's 20 and 22 substantially constant with such variations.

The invention claimed is:
1. An oscillator comprising:
   a capacitor having a first lead connected to a first potential, and having a second lead;
   a first transistor connected to said second lead of said capacitor for charging said capacitor toward a second potential during a first portion of a plurality of cycles;
   a second transistor connected to said second lead of said capacitor for discharging said capacitor during a second portion of said plurality of cycles;
   means including a first trip circuit having a relatively low trip point and a second trip circuit having a relatively high trip point, connected to said second lead of said capacitor responsive to the charge on said capacitor attaining a first level of voltage while it is changing in one direction for enabling one of said transistors at the beginning of one of said portions and responsive to the charge in said capacitor attaining a second level of voltage while it is changing in a direction opposite the said one direction for disabling said transistor at the end of said one portion;
   a bistable circuit having a first input connected to the output of one of said first trip circuit and a second input connected to the output of said second trip circuit, respective complementary outputs of said bistable circuit being connected to the input of a respective one of said first and second transistors;
   a first clamping circuit connected to the input of said first transistor; and
   a second clamping circuit connected to the input of said second transistor.

2. The combination according to claim 1, wherein said first clamping circuit is adapted to clamp the input of said first transistor at a first clamping voltage level approximately equal to the minimum expected voltage level of said first potential, and said second clamping circuit is adapted to clamp the input of said second transistor at a second clamping voltage level which is less than said first clamping voltage level.

3. The combination according to claim 2, wherein said first and second transistors are field effect transistors, said first clamping circuit is further adapted to cause the saturation current of said first transistor to vary indirectly with variations in its threshold voltage, and said second clamping circuit is adapted to cause the saturation current of said second transistor to vary directly with variations in its threshold voltage.

4. The combination according to claim 2, wherein said first clamping circuit is adapted to maintain a maximum voltage level on the input of said first transistor which is greater than the minimum voltage required for conduction of said first transistor and less than the minimum voltage level of a power supply connected thereto.

5. The combination according to claim 4, wherein said second clamping circuit is adapted to maintain a maximum voltage level on the input of said second transistor which is greater than the minimum voltage required for conduction of said first transistor and less than the minimum voltage level of a power supply connected thereto.

6. The combination according to claim 5, wherein said first clamping circuit is further adapted to provide a saturation current in said first transistor which is directly proportional to variations in process parameters and said second clamping circuit is further dimensioned to provide a saturation current in said second transistor which is indirectly proportional to variations and at least one process parameter.

* * * * *